United States Patent [19]

Severns et al.

[11] Patent Number: 5,121,531
[45] Date of Patent: Jun. 16, 1992

[54] REFRACTORY SUSCEPTORS FOR EPITAXIAL DEPOSITION APPARATUS

[75] Inventors: David W. Severns, Sunnyvale; Paul R. Lindstrom, Aptos, both of Calif.

[73] Assignee: Applied Materials, Inc., Santa Clara, Calif.

[21] Appl. No.: 742,569

[22] Filed: Aug. 7, 1991

Related U.S. Application Data

[63] Continuation of Ser. No. 548,789, Jul. 6, 1990, abandoned.

[51] Int. Cl.⁵ .............................................. C23C 16/00
[52] U.S. Cl. .................... 29/25.01; 118/728; 118/729; 437/925
[58] Field of Search ............... 118/728, 729; 437/925; 29/25.01

[56] References Cited

U.S. PATENT DOCUMENTS

| 4,099,041 | 7/1978 | Berkman et al. | 118/728 |
| 4,823,736 | 4/1989 | Post et al. | 118/728 |
| 5,038,711 | 8/1991 | Dan et al. | 118/728 |

OTHER PUBLICATIONS

IBM Technical Disclosure Bulletin, "High-Capacity Narrow Susceptor for Vapor Growth Process", vol. 13, No. 3, Aug. 1970, pp. 804–805.

*Primary Examiner*—Olik Chaudhuri
*Assistant Examiner*—Ourmazd S. Ojan
*Attorney, Agent, or Firm*—Robert Stoddard

[57] ABSTRACT

A hollow graphite susceptor for supporting semiconductor substrates during processing in epitaxial reactor systems. The susceptor has reduced wall thickness to provide lower thermal mass for rapid heating and high wafer throughput. Early failure of this thin-walled susceptor is avoided by providing a raised reinforcing boss on its interior surface in alignment with each recess on the exterior surface.

20 Claims, 1 Drawing Sheet

REFRACTORY SUSCEPTORS FOR EPITAXIAL DEPOSITION APPARATUS

This is a continuation of copending application Ser. No. 07/548,789 filed on Jul. 6, 1990, now abandoned.

BACKGROUND OF THE INVENTION

The present invention relates generally to the field of semiconductor wafer fabrication equipment useful in the manufacture of semiconductor devices, more particularly to apparatus for depositing an epitaxial layer from a source gas by the chemical vapor deposition (CVD) method, and especially to improvements in the design of a refractory susceptor for use in supporting semiconductor substrates in an epitaxial deposition apparatus.

Apparatus of the above type is used in the fabrication of semiconductor devices on 100 millimeter or larger wafers of silicon. Epitaxial layers are formed on the surfaces of the wafers by heating them to temperatures in the region of 1100 to 1200 degrees Celsius in a bell jar containing a gaseous atmosphere consisting of a hydrogen carrier gas mixed with one or more reactive gases such as a silicon source gas or a dopant source gas.

During the various processing steps involved in the production of finished wafers, the semiconductor substrates are supported on a susceptor made of graphite which has been coated with silicon carbide. Such susceptors are formed as a hollow, elongate body having a polygonal cross-sectional shape by being milled from a solid block of graphite. The wall thickness of the susceptor has been on the order of 0.200 inch to provide sufficient strength to withstand normal handling and thermal cycling.

The susceptor together with the wafers supported on it must be heated to the high processing temperatures before processing can begin. The time and power input required to raise the temperature of the susceptor and substrates is largely dependent on the thermal mass of the susceptor, since the thermal mass of the substrates is relatively small.

Consequently, it would be very desirable to reduce the thermal mass of the susceptor in order to reduce the time and energy required to heat it to processing temperatures. At the same time, the quantity of hydrogen carrier gas consumed in processing operations would also be reduced. The net effect of such changes would be an increase in wafer throughput and a reduction in processing cost per wafer.

SUMMARY OF THE INVENTION

An object of the present invention is to provide an epitaxial reactor system having enhanced processing speed and wafer throughput when compared to prior art systems.

A further object of the present invention is to provide an epitaxial reactor system having a lower operating cost per wafer.

A further object of the present invention is to provide an epitaxial reactor system in which the time to raise the temperature of the substrates to processing temperature is reduced.

A further object of the present invention is to provide an epitaxial reactor system in which the consumption of energy during processing operations is reduced.

A further object of the present invention is to provide an epitaxial reactor system in which the consumption of hydrogen carrier gas during processing operations is reduced.

A further object of the present invention is to provide an epitaxial reactor system in which the thermal mass of the susceptor used to support the substrates is significantly reduced.

A further object of the present invention is to provide such a reduced-thermal-mass susceptor with a usable life which is as long as possible.

To the above ends, an epitaxial reactor system according to the present invention uses a hollow graphite susceptor which resembles the susceptors used in prior art systems but which has an average wall thickness only half that of prior-art susceptors. Early failure of this susceptor is avoided by providing reinforcing bosses at points where thermal cycling causes high stress.

In particular, such a susceptor must be provided with surface recesses to facilitate insertion and removal of substrates through the use of the mechanical fingers or grippers of a robotic loader. Other surface recesses must be provided to permit optically sensing the position of the substrate in order to guide the robotic loader.

In accordance with the present invention, such recesses can be provided in a thin-walled susceptor without causing premature failure through cracking around the sites of the surface recesses by providing reinforcing bosses on the inside surface of the susceptor in alignment with each of the recesses on the exterior surface thereof. The effect of these bosses is to locally thicken and reinforce the wall of the susceptor such that failure at the site of the recesses is avoided.

BRIEF DESCRIPTION OF THE DRAWING

The above and other features, objects, and advantages of the present invention, together with the best mode contemplated by the inventors thereof for carrying out their invention will become more apparent from reading the following detailed description of embodiments of the invention while studying the associated drawing, the various figures of which represent.

DETAILED DESCRIPTION OF THE PRESENT INVENTION

Figure 1:
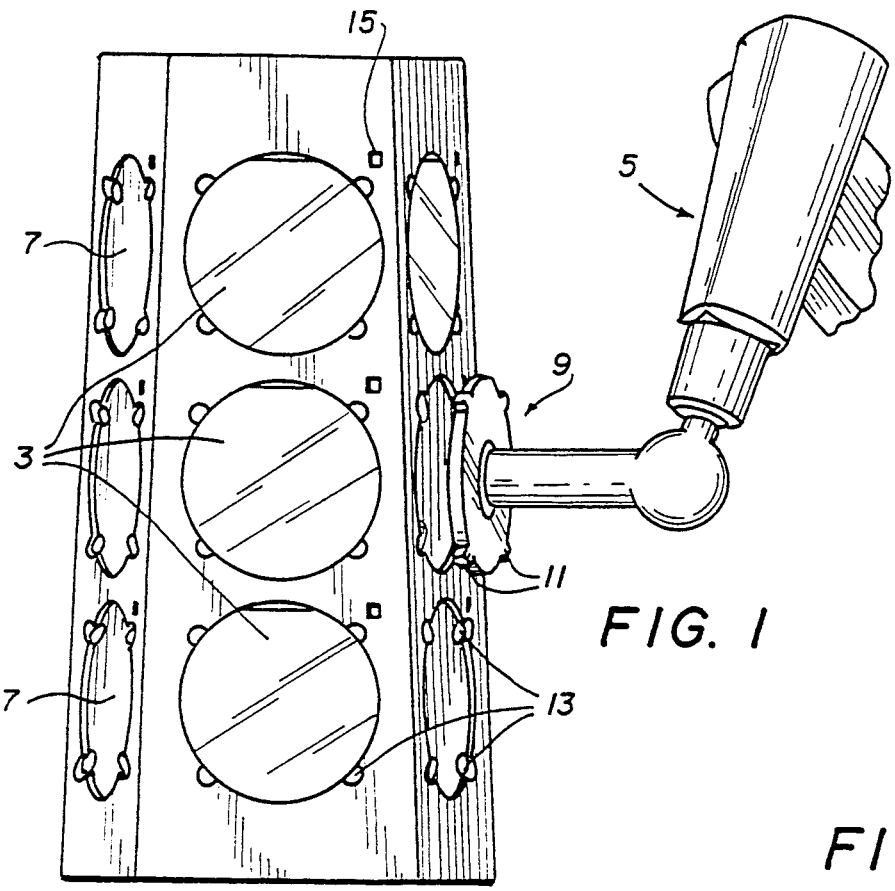
FIG. 1 is a side elevational view of a susceptor according to the present invention.

In FIG. 1, a graphite or other refractory susceptor 1 is illustrated during the act of loading or unloading substrates 3 using a robotic loader 5. Each of the substrates 3, which might be circular wafers of silicon having a diameter of 150 mm for example, is received within a shallow recess 7 on one of the faces of susceptor 1.

As illustrated, susceptor 1 has a pentagonal cross-sectional shape in a direction transverse to its vertical axis. Since each of its five faces has three shallow recesses 7, the total capacity of susceptor 1 as illustrated is fifteen substrates. However, it will be understood that the susceptor 1 could have any other polygonal cross-sectional shape, such as tetragonal, hexagonal, or septagonal, and that the number of substrates per side might be more or less than three.

During the operation of loading and unloading substrates, susceptor 1 is supported by being hung from a suspension mechanism (not shown) which permits each of the sides of susceptor 1 to be successively rotated into position facing robotic loader 5. An end effector 9 on loader 5 is provided with four gripping fingers 11 which engage the edges of a substrate at four spaced points.

In order to provide clearance for fingers 11 to grip the edge of a substrate which is supported within a recess 7 on susceptor 1, four corresponding gripper recesses 13 are provided in the exterior surface of susceptor 1 at each substrate location, spaced about the perimeter of each shallow recess 7. Each of these gripper recesses may comprise a depression in the shape of a short circular cylinder having, for example, a diameter of 0.408 inch and a depth of 0.125 inch.

Since the depth of shallow recesses 7 is desirably only approximately 0.050 inch, for example, gripper recesses 13 extend below the floor of recess 7 sufficiently to permit fingers 11 to extend over the edge of a substrate 3 to ensure firm engagement of the edge of the substrate. For similar reasons, each of gripper recesses 13 is positioned such that it extends partly under a substrate supported within a shallow recess 7. In other words, each of recesses 13 is substantially bisected by the perimeter of the associated shallow recess 7 such that complete access to the edge of a substrate within the shallow recess is afforded at each of the locations of a gripper recess 13.

To permit rapid and accurate location of the exact position of each substrate for loading and unloading, a locating recess 15 is provided adjacent each of the shallow recesses 7. As shown on the side of susceptor 1 facing the viewer in FIG. 1, locating recesses 15 may be square in shape such as to present a distinctive image which is sensed by an optical sensor (not shown). Since the position of the substrate with respect to the locating recess 15 is known, the robotic loader 5 can thus be aligned with each of the substrates to a high degree of accuracy. Locating recesses 15 may be approximately 0.45 inch on each side and 0.066 inch deep, for example.

When susceptor 1 is fully loaded with substrates 3, it is raised to temperatures on the order of 1100-1200 degrees Celsius in a reaction chamber (not shown) filled with a reactive gas mixed with hydrogen. The time required to do this and the energy consumed in the process are both functions of the thermal mass of the susceptor and its substrates. Accordingly, it would be desirable to lower the thermal mass of the susceptor 1 insofar as possible since this would lower the consumption of energy and hydrogen and increase the wafer throughput. All of these consequences would result in a reduction of the cost per wafer processed.

Since the external dimensions of the susceptor 1 are largely fixed by the requirement to support a given number of wafers of a specified size, little or no reduction of overall size can be achieved. Accordingly, the only possible way to reduce the thermal mass of the susceptor while continuing to use graphite as the material is to reduce the wall thickness of the susceptor.

Prior to the work which led to the development of the techniques of the present invention, susceptors of the type exemplified in FIG. 1 had been fabricated by milling them from solid bodies of graphite to a wall thickness of approximately 0.190 inch. They were then plated with a 0.005 inch layer of silicon carbide to strengthen them and prevent absorption and subsequent outgassing of vapors.

When significant reduction of the wall thickness of these susceptors was attempted, the result was early failure of the susceptor in use. An analysis of the failures revealed that they were caused by the formation of cracks in the areas of the gripper recesses 13 and locating recesses 15. The reduction in local wall thickness and the abrupt discontinuity which these recesses represented caused excessive local stress and consequent early failure during thermal cycling.

Figure 2:
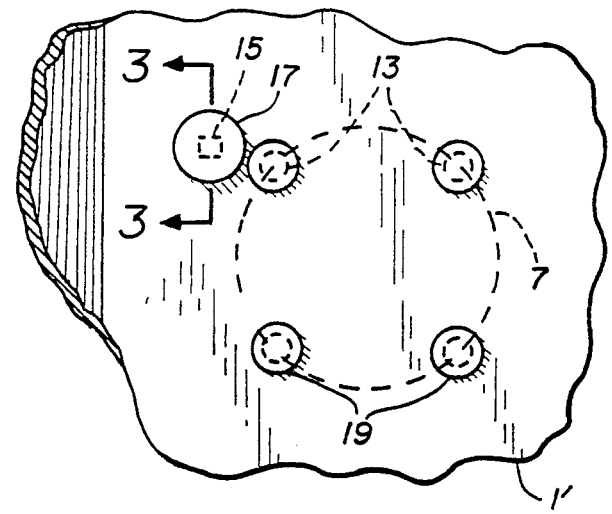
FIG. 2 is a partly cross-sectional view of a portion of the susceptor according to the present invention.
Figure 3:
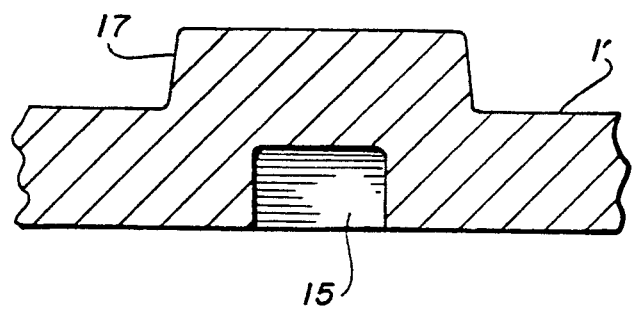
FIG. 3 is a cross-sectional view, greatly enlarged, showing the portion of FIG. 2 delineated by lines 3—3 thereof.

Turning now to FIGS. 2 and 3, the novel susceptor structure according to the present invention is illustrated. In FIG. 2, the area of the susceptor around the site of any one of the substrate locations is shown as it would be when viewed from inside the susceptor 1'. Accordingly, shallow recess 7, gripper recesses 13, and locating recess 15 are all shown in dotted outline. Plainly noticeable in FIG. 2 is the fact that each of gripper recesses 13 extends across and is bisected by the perimeter of shallow recess 7 as discussed earlier in this description.

In accordance with the present invention, however, the susceptor 1' of FIGS. 2 and 3 has been provided with a raised reinforcing boss 17 on the interior surface of susceptor 1' in alignment with locating recess 15 which is formed in the exterior surface of susceptor 1'. The relationship of these elements is clearly shown in the enlarged cross-sectional view of FIG. 3. Similarly, each of the gripper recesses 13 has been provided with a raised reinforcing boss 19 as shown in FIG. 2.

It has been found that the provision of these raised reinforcing bosses on the interior surface of susceptor 1' in alignment with the gripper recesses 13 and locating recesses 15 can provide enough local reinforcement of the regions around the recesses to permit reduction of the wall thicknesss of the susceptor to approximately 0.100 inch without encountering the loss of susceptor life which was occasioned when wall thickness was reduced without the use of reinforcement around the recesses. Moreover, the use of such reinforcing bosses does not cause any appreciable increase of thermal mass, since the increased amount of graphite needed to provide them is negligible.

Although the size of the reinforcing bosses 17 and 19 is not thought to be critical, they should have a height or thickness at least equal to the depth of the recess which is being reinforced, and a diameter of 1.5 to 2 times the largest dimension of the recess.

Although this invention has been described with some particularity with respect to a preferred embodiment which represents the best mode known to the inventors thereof for carrying out their invention, many changes could be made and many alternative embodiments could thus be derived without departing from the scope of the invention. Consequently, the scope of the invention is to be determined only from the following claims.

We claim:

1. A susceptor for supporting a substrate within a reaction chamber, said susceptor comprising:
   a hollow, elongate, generally thin-walled susceptor body member;
   a first recess defined in the exterior surface of said susceptor body member at a first location thereon; and,
   reinforcing means on the interior surface of said body member in alignment with said first recess in said exterior surface for reinforcing the thin wall of said susceptor body member in the region of said first recess.

2. The susceptor of claim 1 wherein said reinforcing means comprises:
   a raised boss on said interior surface of said body member.

3. The susceptor of claim 2 wherein said raised boss is dimensioned large enough to be at least coterminous in surface extent with said recess.

4. The susceptor of claim 3 wherein said raised boss is dimensioned to have a thickness which is at least nearly equal to the depth of said first recess.

5. The susceptor of claim 1 wherein said susceptor is made of a refractory material.

6. The susceptor of claim 5 wherein said susceptor is formed of graphite.

7. The susceptor of claim 6 wherein said susceptor is formed by being milled from a solid block of graphite.

8. The susceptor of claim 7 wherein said susceptor has a wall thickness less than 0.110 inch.

9. The susceptor of claim 2 wherein said raised boss is formed as an integral portion of said susceptor.

10. The susceptor of claim 9 wherein said susceptor body member and said raised boss are integrally formed of a refractory material.

11. The susceptor of claim 1 further including:
    substrate support means on the exterior surface of said susceptor for supporting a substrate at a second location thereon predetermined with respect to said first location.

12. The susceptor of claim 11 wherein said substrate support means comprises a shallow recess in the exterior surface of said susceptor at said second predetermined location thereon, said shallow recess being bounded by a perimeter shaped and dimensioned to generally match the perimetric shape and dimensions of said substrate.

13. The susceptor of claim 12 wherein said first recess is positioned at said first location extending across said perimeter and partially into said shallow recess to provide access to the edge of a substrate positioned in said shallow recess.

14. The apparatus of claim 12 wherein said first recess is positioned at said first location spaced a predetermined distance away from said substrate support means along a predetermined axis to define an optically sensible locating target for determining the position of a substrate on said susceptor.

15. The susceptor of claim 11 wherein said substrate support means comprises:
    a shallow recess in the exterior surface of said susceptor at said second predetermined location thereon, said shallow recess being bounded by a perimeter shaped and dimensioned to generally match the perimetric shape and dimensions of said substrate; and further including
    a second recess in the exterior surface of said susceptor positioned extending across said perimeter and partially into said shallow recess to provide access to the edge of a substrate positioned in said shallow recess.

16. The susceptor of claim 15 wherein said substrate has a generally circular perimetric shape, and wherein the perimeter of said shallow recess is correspondingly generally circular in shape and of a diameter to accommodate said substrate, and further including third, fourth, and fifth recesses in the exterior surface of said susceptor,
    said second, third, fourth, and fifth recesses being positioned at points spaced along said perimeter and extending across said perimeter and partially into said shallow recess to provide access to the edge of said substrate at each of said points.

17. The method of supporting a semiconductor substrate for processing in a reactive gaseous environment, comprising the steps:
    providing a closable reaction chamber for confining said reactive gaseous environment in contact with said substrate;
    providing a hollow elongate susceptor having a wall thickness less than 0.110 inch for supporting said substrate within said reaction chamber;
    providing a first recess in the exterior surface of said susceptor adjacent the location of said substrate thereon for optically locating said substrate;
    providing a first raised reinforcing boss on the interior surface of said body member in alignment with said first recess in said exterior surface, said raised boss having a thickness which is at least nearly equal to the depth of said first recess.

18. The method of claim 17 further including the step of:
    providing a second recess in the exterior surface of said susceptor, said second recess having a portion thereof extending under said substrate, the remaining portion of said second recess extending beyond the perimeter of said substrate to permit access to an edge portion of said substrate for insertion and removal thereof from said susceptor;
    providing a second raised reinforcing boss on the interior surface of said body member in alignment with said second recess in said exterior surface, said second boss having a thickness which is at least nearly equal to the depth of said second recess.

19. A method of reducing the cost of processing substrates in a heated environment wherein a susceptor supports said substrate during heating and processing thereof which comprises reducing the wall thickness of said susceptor to 0.110 inch or less and providing a reinforcing boss on the interior surface of said susceptor in alignment with a recess on the exterior surface of said susceptor whereby damage to said susceptor from thermal cycling is reduced.

20. A method according to claim 19 wherein said boss has a thickness about the depth of said recess.

* * * * *